United States Patent [19]

Bantz et al.

[11] Patent Number: 5,397,423
[45] Date of Patent: Mar. 14, 1995

[54] MULTI-HEAD DIE BONDING SYSTEM

[75] Inventors: George H. Bantz, New Canaan, Conn.; Jeffrey A. LaPat, Perkasie, Pa.

[73] Assignee: Kulicke & Soffa Industries, Willow Grove, Pa.

[21] Appl. No.: 68,083

[22] Filed: May 28, 1993

[51] Int. Cl.⁶ .................... B32B 31/00; B65C 9/40; B23P 19/00
[52] U.S. Cl. .................... 156/362; 156/350; 156/538; 156/539; 156/566; 29/739; 29/742; 29/743; 29/759
[58] Field of Search ............ 156/539, 566, 360, 362, 156/538; 29/739, 740, 742, 743, 759, 760; 198/345.1, 793, 803.3

[56] References Cited

U.S. PATENT DOCUMENTS

| | | | |
|---|---|---|---|
| 2,795,315 | 5/1957 | Hahir et al. | 198/803.3 |
| 4,088,220 | 5/1978 | Jacksch et al. | 198/793 X |
| 4,372,802 | 2/1983 | Harigane et al. | |
| 4,526,646 | 7/1985 | Suzuki et al. | |
| 4,527,327 | 7/1985 | Van Deuren | 29/740 |
| 4,631,812 | 12/1986 | Young | |
| 4,809,430 | 3/1989 | Maruyama et al. | 29/739 X |
| 4,908,092 | 3/1990 | Koibuchi | 29/743 X |
| 4,951,388 | 8/1990 | Eguchi et al. | 29/739 X |

*Primary Examiner*—David A. Simmons
*Assistant Examiner*—M. Curtis Mayes
*Attorney, Agent, or Firm*—Barnes & Thornburg

[57] ABSTRACT

A multi-tool bonder having a plurality of die heads flexibly mounted on a conveyor which spaces and moves the heads along a path which includes a plurality of die processing stations. An alignment mechanism is provided at each stationary processing station for aligning the head at a fixed position along the path at the station. A controller controls the conveyor to position the plurality of heads at the stations and controls operation of the heads at the stations.

20 Claims, 6 Drawing Sheets

MULTI-HEAD DIE BONDING SYSTEM

BACKGROUND AND SUMMARY OF INVENTION

The present invention relates generally to apparatus for bonding electronic dies to a substrate and more specifically to a multi head bonder.

Inner lead bonders for bonding dies to the leads of a carrier tape can be performed with extreme accuracy since the positioning of the leads on the carrier tape is well controlled. A typical example is U.S. Pat. No. 4,526,646 to Suzuki, et al. wherein the carrier tape 16 has its XY position adjusted with respect to the bond site. Die positioning fingers 43 adjust the θ and the X coordinate of the die with respect to table 40. A die defect detection camera 81 is provided at the wafer pick-up station. A die positional pattern detecting camera 83 detects positional deviation in the Y direction. A lead positional pattern detection camera 85 detects the position of the lead pattern at the bond site. The positional deviation of the lead pattern of the carrier tape 16 from the pattern of the die 51 detected by camera 83 is computed. Then, the XY table 31 is driven to adjust the tape carrier with respect to the bond head 10 in die 51 for the computed deviation.

The Suzuki, et al. patent is just one of many patents which illustrate the use of a pair of tools to transport a die in a bonder between three specific stations. In that it uses a pair of tools, each of the tools can operate simultaneously thereby increasing the through-put. This is to be distinguished from a single tool reciprocating along a single path between all the stations as illustrated in FIG. 1 which is a die bonder model "Argus" from Assembly Technologies of Horsham, Pa. Both of these systems are only capable of processing a plurality of dies of the same dimension and characteristics.

In an attempt to further increase the through-put of a die bonder, multiple tools can be used. An example is shown in U.S. Pat. No. 4,372,082 to Harigan, et al. A vacuum shifting head 18 transfers dies 20 from a pallet 8 to a plurality of mounting heads 15 on a turret mounting mechanism 16. As illustrated in FIG. 6, the turret has eight positions from the die receipt position A to the die mounting position E. The die is aligned by claws 124 at position B as illustrated in FIGS. 25–28. At position C, the θ of die is adjusted by motor 72 through appropriate gears as illustrated in FIGS. 8 and 20. Actuation for the lowering block 80 at the bonding station is illustrated in the FIGS. 19, 21 and 22. The connection of the vacuum source to the suction pin 44 of mounting 15 is illustrated specifically in FIG. 22. Although this design improves the through-put, it is a specifically designed machine and the use of an expensive turret with additional transfer mechanisms is not economical, nor does it allow adaption to existing machines of the prior art as illustrated in FIG. 1.

Thus, it is an object of the present invention to provide a multi-head die bonding machine which is capable of being used with existing bonders.

Another object of the present invention is to provide a multi-head die bonding system which can replace and be used in the envelope of the drive in reciprocal bonders.

An even further object of the present invention is to provide a die transport system which operates in a unit in a single direction.

A still further object of the present invention is to provide a multi-head die bonding system which includes different tool configurations for different sizes of dies for die kits.

A still even further object of the present invention is to provide a multi-head die bonding system wherein each of the heads are individually programmable to by pass disabled or faulty die heads.

These and other objects are achieved by mounting a plurality of die heads on a conveyor which spaces and moves the heads along a path. An alignment mechanism is provided at each station for aligning the head at a fixed position along the path at the station. A controller controls the conveyor to position the plurality of heads at the stations and controls operation of the heads at the stations. The conveyor includes at least one and preferably two vertically spaced endless flexible belts. The heads are mounted to a flexible mount on the belts. The path includes a die supply station, a bonding station and at least one processing station between the die supply station and the bonding station. The heads are spaced along the conveyor such that more than one head is in the path at a time and preferably one head at each of the stations. The conveyor intermittently moves the heads between the stations and through a fly processing station if one is provided.

The alignment mechanism at each of the stations includes a first and second jaw movable relative to each other and transverse to the path for clamping the heads at a fixed position in two orthogonal directions at the stations. Preferably, the first jaw is stationary and the second jaw, which includes an indenture, is movable. Drivers may be provided at one or more stations for mating with the head to control the orientation of the head at the station. The driver and the movable jaw may be provided on a common carriage for positioning the second jaw and the driver at the station once the head is in place. The driver may raise or lower the head. Another kind of driver would adjust the angular position of the head and may be provided on the carriage or may be movable on a separate carriage. A vacuum source is connected to the individual heads such that the head can rotate relative to the connection for angular positioning of the head about a vertical axis. At least two of the heads are configured for different dies and the controller is programmable for each configuration. Similarly, the controller is programmable to selectively operate or not operate each head at each station.

Other objects, advantages and novel features of the present invention will become apparent from the following detailed description of the invention when considered in conjunction with the accompanying drawings.

BEST MODES FOR CARRYING OUT THE INVENTION

Figure 1:
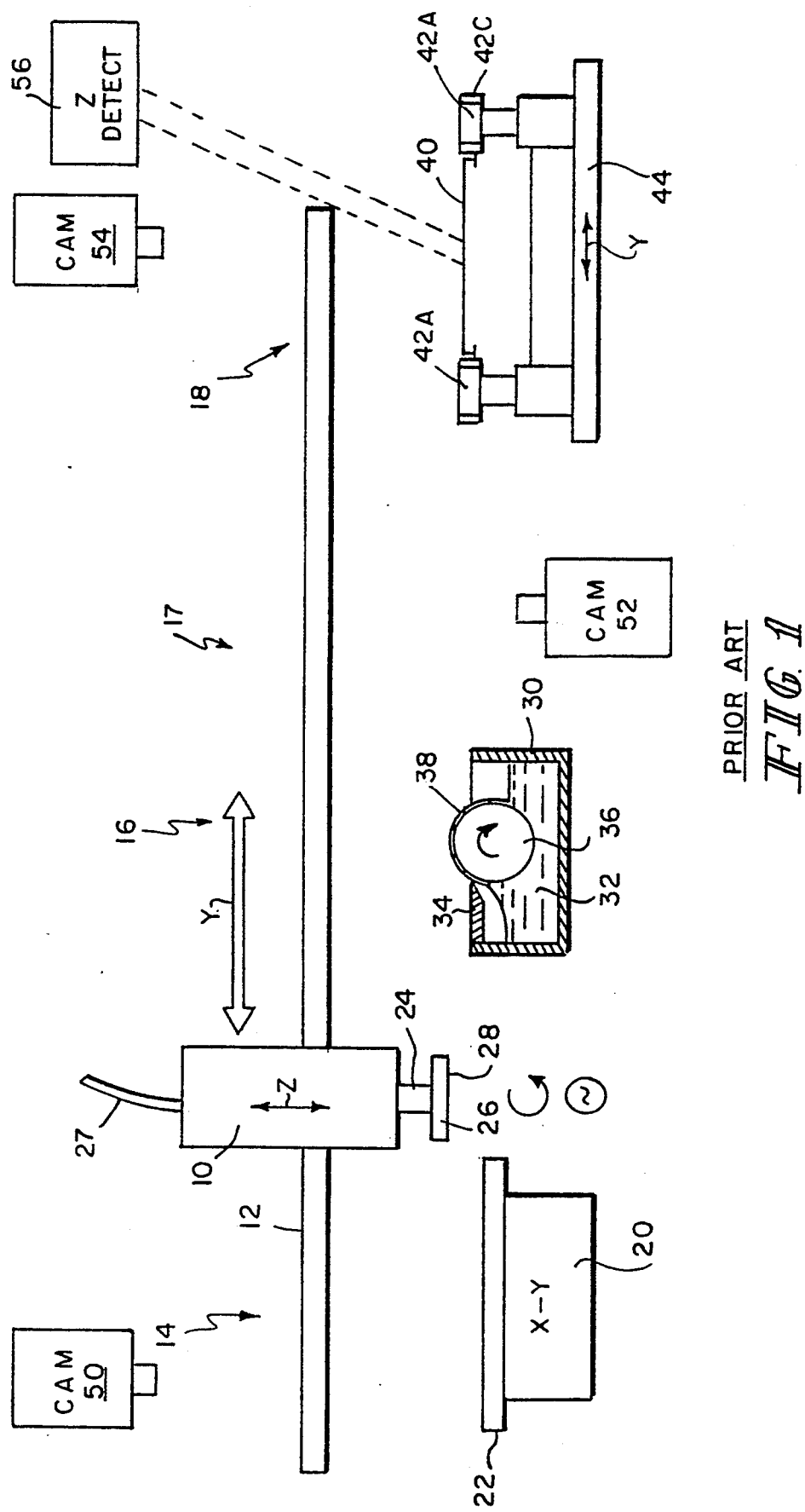
FIG. 1 is a schematic side view of a bonding system including a die paste station of the prior art.

A bonding system of the prior art is illustrated in FIG. 1 and includes a die transport 10 having one bonding head 24, reciprocating along rail 12 between a wafer or pick-up station 14 through a paste station 16 to a bonding station 18 where a die is bonded to a substrate and then back to the pick-up station 14. The wafer station 14 includes an X-Y table 20 to position the wafer 22 which includes a plurality of dies. The die transport 10 include a bond head 24 which extends down to and picks up die 26 which has been positioned by the X-Y table 20. The bond head 24 is then raised and moved in the Y direction toward the bonding station 18. A die 26 is shown as being retained in the bond head 24 by a vacuum provided at port 27. During transport, paste is applied to a bottom surface 28 of die 26.

The paste station 16 is shown as including a reservoir 30 having paste 32 therein. A roller 36 has surface which rotates into and out of the reservoir and relative to a doctor blade plate 34 to form a layer 38 of bonding paste on the exterior of the roller 36. As the transport 10 moves continuously through the paste station 16, the surface 28 of the die 26 comes into contact with the layer 38 of paste to transfer a layer of paste onto a surface 28 of die 26 as it travels to the bonding station 18. Alternatively, the paste may be applied to the bond site on a substrate prior to or at the bonding station 18.

The bonding station 18 includes a substrate or a boat 40, which carries a substrate, moved in the X direction by a substrate transport 42 from a magazine and to storage. The transport 42 includes a set of rollers 42A having a conveyor belt 42C which engages one side of the sides of the substrate or boat 40 and a set of rollers which engage the other side of the substrate 40. The rollers 42A and 42B are adjustable in the Y axis to accommodate various width substrates or boats. A table 44 moves the rollers 42A and 42B along the Y axis to position the substrate 40 along the Y axis.

Once the die transport 10 has come to rest at a preselected position at the bonding station 18, the bond head 24 is lowered to position the die 26 with the bonding material on surface 28 on a bond site on the substrate. The appropriate pressure and time of application produces acceptable bonding.

The systems required to operate the transport system for the wafer, the die transport 10, and the substrate transport 42 are well known as is exemplified by the patents previously discussed as well as being available in die bonder model Argus from Assembly Technologies of Horsham, Pa.

The alignment and quality control system includes four sensors. A first or wafer camera 50 is at the wafer station 14 to detect the quality of the dies at the wafer as well as to position the appropriate die on the wafer 22 relative to the bond head 24. A second or die camera 52 is provided between the wafer station 14 and the bonding station 18, and preferably after the paste station 16. The die camera 52 at die adjust station 17 determines the position of the die 26 on the die transport 10 or bond head 24 as well as the quality of the paste layer provided by paste station 16. A third or bond camera 54 is provided at the bonding station 18 to determine the location and the quality of the bond sites at the bonding station prior to bonding and the position of the die and quality of the bond after bonding. A detector 56 is provided to determine the Z position of the bond site and may also be used to determine the planarity of the bond site prior to bonding and the die position and planarity or tilt after bonding. The control system, including a computer, includes pattern recognition for position as well as quality control.

A cycle of operation of the bonding system begins with the X-Y table 20 orientation the wafer 22 so that a die is located at the pick-up site. The system using camera 50 checks the quality of die. Bad dies are passed over and the X-Y table 20 continues to orient die until a good die is in the pick-up position. Camera 50 is also used for positioning dies at the pick-up site. While the wafer is being oriented, a boat or substrate is injected into the Boat Transport 42.

When a good die is available for pick-up, the die transport 10 moves back to a set Y pick-up position. Vacuum is applied to the bond head 24 via port 27. The plunge up program starts to strip the die from its tape backing on the wafer 22. The bond head 24 is lowered and in concert with the two stage plunge-up picks the die 26 from the wafer 22.

Meanwhile, the boat transport 42 has moved the boat 40 to a bond position 18 and scanned it with detector 56 to determine that a ceramic package or substrate is present. If no package is present, the boat is indexed by 42C and scanned until a package is detected. The package depth is also recorded as the package is scanned. The depth must be within programmed limits for the package to be deemed good.

The system using camera 54 checks the quality of the bond site. This can include the paste pattern if the paste pattern is applied to the substrate as well as the conductive pattern or lead frames on the substrate. The boat transport 42 will index the boat until an acceptable bond site is provided. The system with camera 54 also determines the X, Y and θ coordinates of the bond sites at the bonding station 18.

Once the bond head 24 has the die 26, it passes the die 26 across the paste station 16 to deposit a coating of paste on the bottom 28 of the die 26. The die 26 is moved over camera 52 at die adjust station 17 to determine how the die 26 is aligned to the center of the bond head 24 or the X, Y and θ coordinates. The pattern recognition system will also determine the quality of the paste pattern on the surface 28 of die 26. The control system determines and rotates the bond head 24 to correct for θ and moves the cavity so as to be accurately positioned at the bond site. The cavity is moved in X by the boat drive 42 and in Y by the Y table drive 44. The next move of the bond head 24 is to a fixed Y position under the bond camera 54.

The control system recalls the value of the depth of the cavity that is recorded when the cavity was scanned by sensor 56, subtracts the die thickness and bondline thickness programmed in during setup, calculate the proper number of steps to lower the bond head 24, then lowers the head this amount. While the bond head 24 is being lowered, a load cell (not shown) is being monitored to insure that excess force is not placed on the die. Once the proper height is obtained, the vacuum is released, a programmed air blow-off and dwell are completed and the bond head 24 retracted. After die placement, the bond camera 54 determines the quality of the die bond and its X, Y and θ and the detector 56 determines the Z and planarity or tilt of the bonded die and accept or reject it. While the bonding was proceeding, the wafer system 20 has positioned the next good die, ready for pick-up.

This is the basic cycle of the bonding system that is repeated. The independent station, working together under the control of a central processor and performing operations in parallel, results in a flexible system that is easy to operate, easy to set up, easy to trouble shoot and yet highly accurate and fast.

Figure 2:
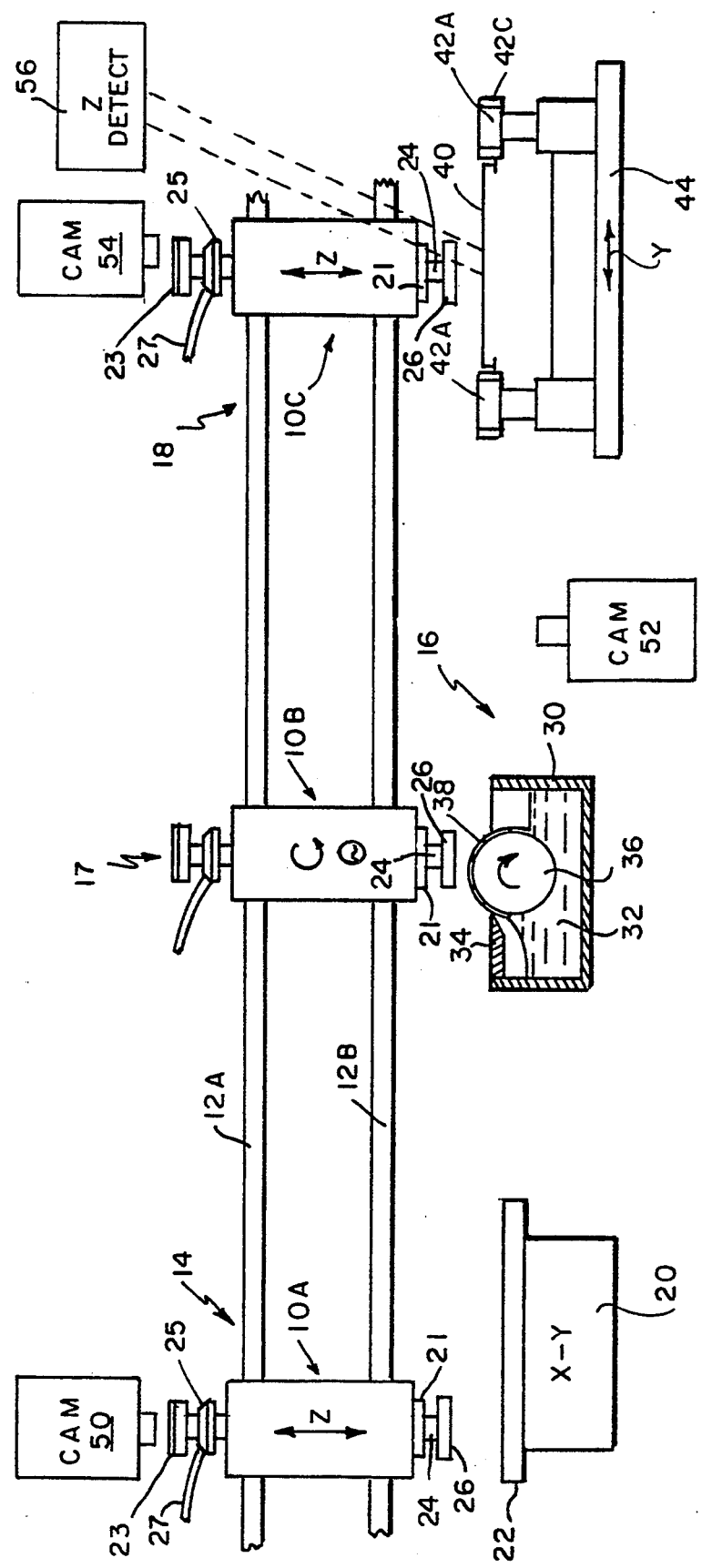
FIG. 2 is a schematic side view of a bonding system incorporating the principles of the present invention.

As an improvement over the prior art system of FIG. 1, the reciprocal conveyor of die transport 10 on the rail 12 have been replaced by a pair of endless belts 12A and 12B to which have been mounted a plurality of die transports illustrated as 10A, 10B and 10C. Each of the transports include a drive coupler 23, vacuum coupling 25 for port 27, head 24, body or guide 29 and friction disc 21. On the other side of the endless belt, which moves in the counter-clockwise direction, are two or three additional die transports 10 not shown in the Figure for sake of clarity. The space between the die transports 10 preferably correspond to the space between the stations at which the heads are stopped for die processing and preferably the die processing stations are equally spaced. Since the example illustrated in FIG. 2 is the modification of a pre-existing system of FIG. 1 wherein the die adjust system 17 is not an equal distance between the pick-up station 14 and the bonding station 18, the space between die transports 10 are selected to be one-half the distance between the pick-up station 14 and the bonding station 18. This would limit the simultaneous operation of the die tools to the pick-up and bonding stations. Paste station 16 is an on the fly station and the endless belts 12A and 12B are not stopped at station 16. The endless belts 12A and 12B and their drives are designed to replace and fit in the envelope of approximately the same size as the existing standard bond head tool and transport assembly illustrated in FIG. 1.

The transport system of FIG. 2 creates a highly flexible system that can be used to transport different tool or head configurations for different size dies of a die kit. Using a single tool configuration for a single die size the through-put is substantially increased. The independent controls of the tools will allow parallel functioning or simultaneous operation at some if not all of the stations which also increases through-put. Any tool or head which displays a problem or a failure during a run can be by-passed and production can be continued as will be discussed below. In the specific implementation, the system is mechanically simple and therefore offers inherent reliability, accuracy and low maintenance.

Figure 3:
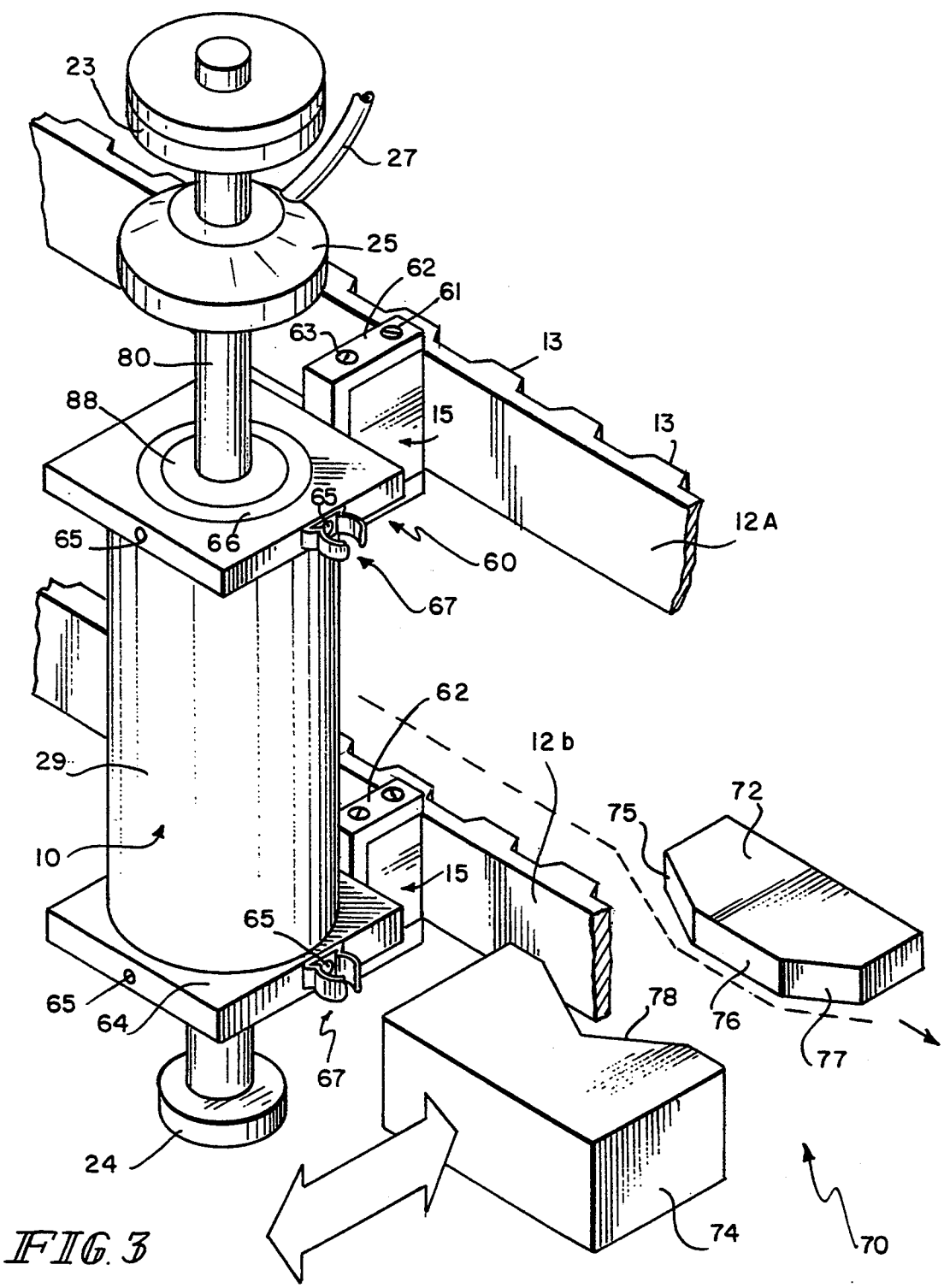
FIG. 3 is a partial perspective view of a single head entering a station which includes an alignment mechanism.

The flexible belts, 12A and 12B, as shown in FIG. 3 are made of a flexible material and include a spaced timing teeth 13 on the back surface. The teeth, in combination with the drive pulleys, accurately position the various tools or heads along the path. Extending from the front face of the flexible belts 12A and 12B are tool mounts 15. The belts 12 A/B with the timing teeth 13 and the tool mounts 15 are an integral molded product. The tool holder 60 is mounted to each of the tool mounts 15. The tool holder 60 includes a yolk or U shaped element 62 which is mounted on the tool mount 15 of the belt 12 A/B and includes a horizontal plate 64 having a recess 66 to receive the tool, head or die transport 10. A dowel 61 extends through the yolk 62 and the mount 15 as does a fastener 63 to mount and stabilize the tool holder 60 with respect to the belts 12 A/B. A pair of orthogonal fasteners 65 in the horizontal plate 64 secure the casing 29 of the die transport 10 thereto. A pair of tube clamps 67 for the vacuum lines connected to vacuum port 27 are mounted to the horizontal plates 64 at their leading surface.

The use of the flexible belts 12A and 12B and the flexible mounts 15 provide a low cost transport system.

To assure the accuracy of the alignment and inspection system, an alignment mechanism, illustrated as a clamp 70 in FIG. 3, is provided at each of the stationary stations. A stationary jaw 72 includes a clamping surface 76 with a entry caming surface 72 and an exit caming surface 77. The body 29 of the die transport 10 rides up on entry caming surface 72 and comes to rest adjacent to the clamping surface 76. A movable jaw 74 includes a V shaped slot 78 and moves toward the clamping surface 76 of the stationary jaw 72 to clamp the body 29 of the die transport 10 therebetween. The body 29 of the die transport 10 and the faces of the jaws 72 and 74 are made of steel to very high tolerance. Thus the longitudinal center line of the tool is accurately located repeatably at the specific stations.

Once the operation on the head is completed at the station, jaw 74 is moved relative to jaw 72 releasing the body 29 of the die transport 10. The endless belts 12A and 12B are then activated to move the die transports 10 to their next position at a respective station. The body 29 of the die transport 10 slides down on exist caming surface 77. The entry and exit caming surfaces 75 and 77 allow the flexible connection of the die transports 10 to be used in combination with the flexible endless belts 12A and 12B while maintaining the accuracy of the alignment of the head 24 at each of the appropriate stations.

Figure 4:
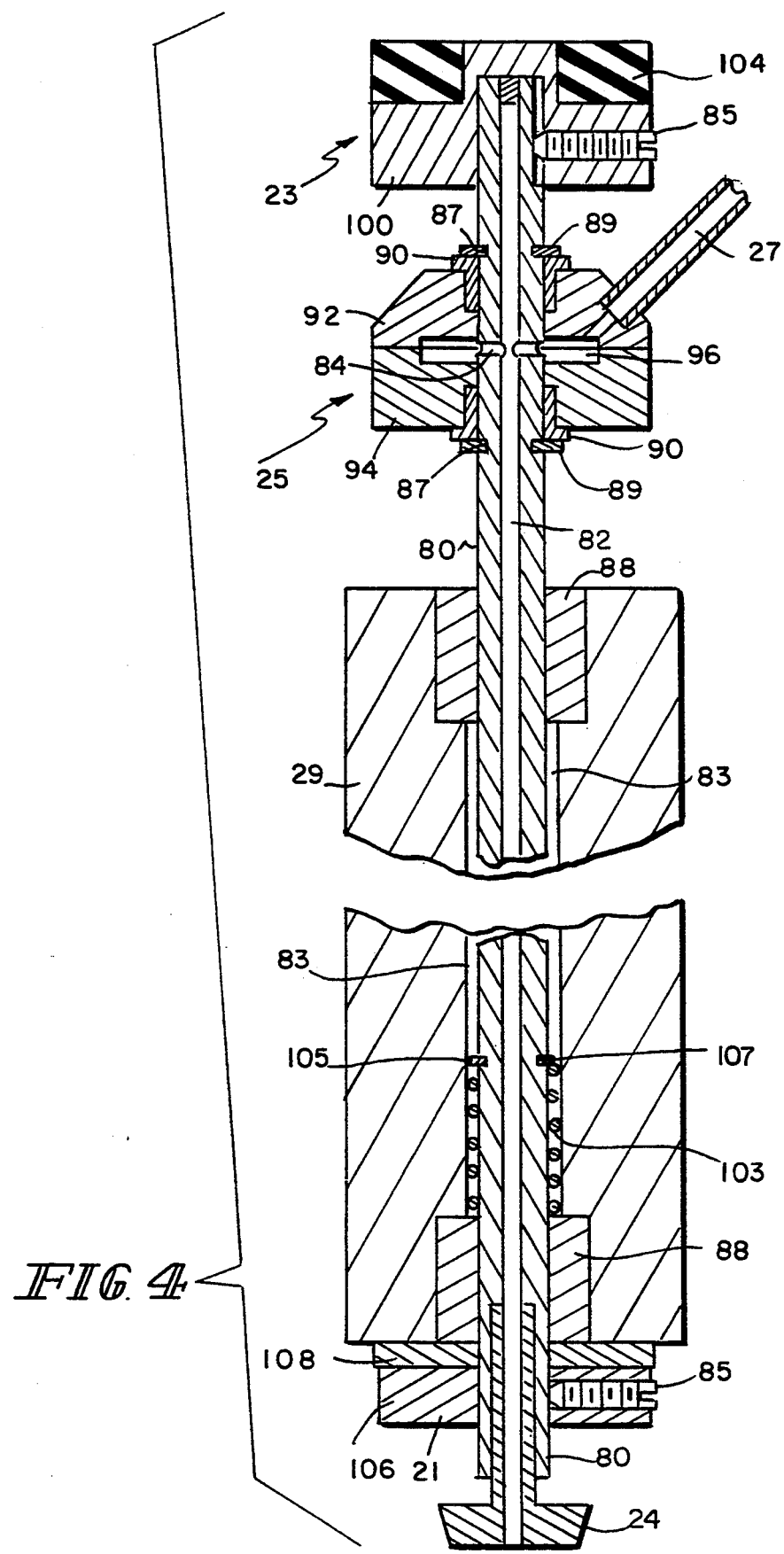
FIG. 4 is a cross-sectional view of portions of the tool without the conveyor mount.

The die transport 10 is illustrated specifically in FIG. 4. A shaft 80 includes a vertical passage 82 connected at its bottom end to the die head 24 and capped at its top end by a pin 81 pressed and glued thereto. Radial passages 84 connect the vertical passage 82 to the interior chamber 96 of vacuum coupling 25 and there through to the source of a vacuum 116 via port 27 and lines 118, shown in FIGS. 5 and 6. Snap rings 89 received in slots 87 of the shaft 80 retain the vacuum coupling 25 therebetween. The drive coupler 23 caps the top end of the vertical passage 82. A first fastener 85 against flat 86 on the shaft 80 mounts and locks the drive coupler 23 to the shaft 80. A second fastener 85 locks the friction disc 21 to the shaft 80. A pair of bearings 88 in each end of the bores 83 of the body 29 rotatably mount the shaft 80 to the housing 29.

The vacuum coupling 25 includes a housing having halves 92 and 94 joined together to form the internal chamber 96 which interconnects the vacuum port 27 to the passages 84 in the shaft 80. A pair of bearings 90 in each of the housing 92, 94 allow the shaft 80 to rotate relative to the vacuum coupling 25. The vacuum port 27 is rigid and is connected to the rotatable vacuum manifold 116 by flexible line 118 shown in FIGS. 5 and 6 mounted to the body 29. The vacuum coupling 25 is at a fixed angular position relative to the body 29. The drive coupling 23 includes a base member 100 with a head 102. A high friction, no slip pad 104 sits on the base 100 around head 102 and is bonded thereto by a glue for example.

As will be explained more fully below, the angular position of the head 24 and shaft 80 are adjusted by a drive onto the top surface of the high friction pad 104. The bearings 90 in the vacuum coupling 25 and bearings 88 in the body 29 allow the shaft 80 and the head 24 to rotate relative to the clamped body 29 and the vacuum coupling 25. The angular position of the shaft 80 is maintained fixed relative to the body 29, when not driven by friction disc 21. Friction disc 21 includes a base 106 with a high friction non-slip pad 108 bonded thereto. When the friction of pad 108 is overcome by a driver on pad 104, the shaft 80 and head 24 is angularly repositioned with respect to the body 29.

To adjust the position of the head in the Z direction, are up and down, a driver engages the head 102 of the drive coupling 23 and lowers shaft 80, head 24, drive coupler 23 and vacuum coupling 25 with the fixed body 29 acting as a guide. A spring 130 is positioned between retaining ring 105 in slot 107 of shaft 80 and lower bearing 88 of the body 29. Upon removal of the downward driver, the spring 103 will raise the shaft 80 and the head 24 to its up position.

Figure 5:
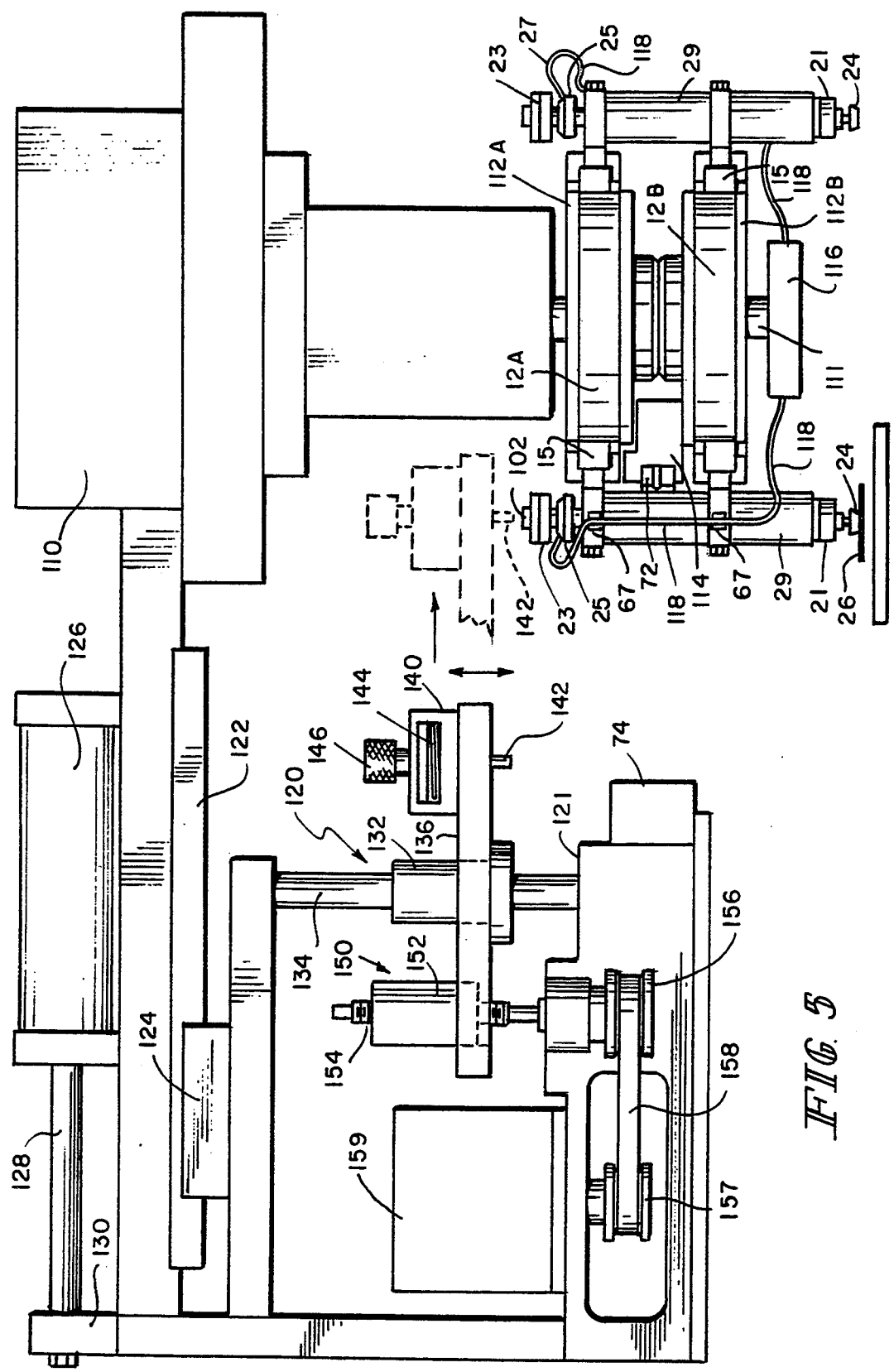
FIG. 5 is a side view of a station including a driver which adjust the orientation in the Z or up-down direction.

The details of one of the stations is illustrated in FIG. 5 wherein the operation to be performed is the raising or lowering of a head 24. This would be at the pick-up station 14 or the bonding station 18. A motor 110 is connected to the endless belts 12A and 12B by drive pulleys 112A and 112B, respectively on shaft 111. A second set of idle pulleys are provided at the other end of the path. A rotating vacuum manifold 116 is also connected to motor 110 by shaft 111. Vacuum line 118 connects the manifold 116 to the port 27 of the individual tools.

The fixed jaw 72 of the clamp 70 is mounted to the frame by block 114 between the belts 12A and 12B. The movable jaw 74 is mounted to block 121 of a carriage 120 which moves transverse to the belts 112A and 112B. The carriage 120 is slidably connected to a rail 122 by a slide 124. An operator shown as cylinder 126 is connected to and controls the position of, the carriage 120 via piston rod 128 and connection 130. Since the carriage has only an extended or retracted position, a more precise positioning element is not needed.

A vertical slide 132 is also mounted to guide 124 of the carriage 120 and includes a horizontal cross bar 136. Mounted to the cross bar 136 is a Z driver 140 and a lead screw mechanism 150. The Z driver 140 includes a pin 142 extending from the bottom thereof and resiliently biased downward by spring 144. When the Z driver 140 is positioned above the head 24, as shown a phantom, and moved down, the pin 142 will engage the head 102 of the drive coupler 23. The spring 144 is considered as sufficient to maintain the pin 142 extended. Once the head 24 contacts either the die 26 to be picked up at the pick-up station, or the substrate on which the die is to be bonded, further downward movement of the driver 140 is absorbed by the spring 144. This prevents damage to the die, pick-up station, and substrate at the bonder. The spring 144 preload is adjusted by knob 146 and is used to control the bond force.

Whereas the lateral or horizontal movement of the carriage is controlled by the cylinder 126, the Z or up and down direction of the driver 140 is controlled by the lead screwed mechanism 150. A threaded sleeve 152 is mounted to the cross bar 136 and the lead screw 154 is rotatably mounted to the carriage block 121. A pulley 156 on the lead screw 154 is connected to pulley 157 by a belt 158. A motor 159 drives the pulleys 157 and pulley 156 via belt 158. The carriage 120 thus includes the driver 140, as well as the movable jaw 74 of the clamp. Thus with one operation, the body 29 of the die transport is aligned and locked in place and the driver 150 is positioned above the die for operation. A separate control is provided to determine the height of the driver 140 and the die head 24.

The requirement that the drive 140 be positioned into and out of alignment with the vertical axis of the tool is necessitated by the cameras 50 and 54 at the pick-up station 14 and the bonding station 18, respectively. After the appropriate detection and monitoring by the cameras, the drive is moved into place.

Figure 6:
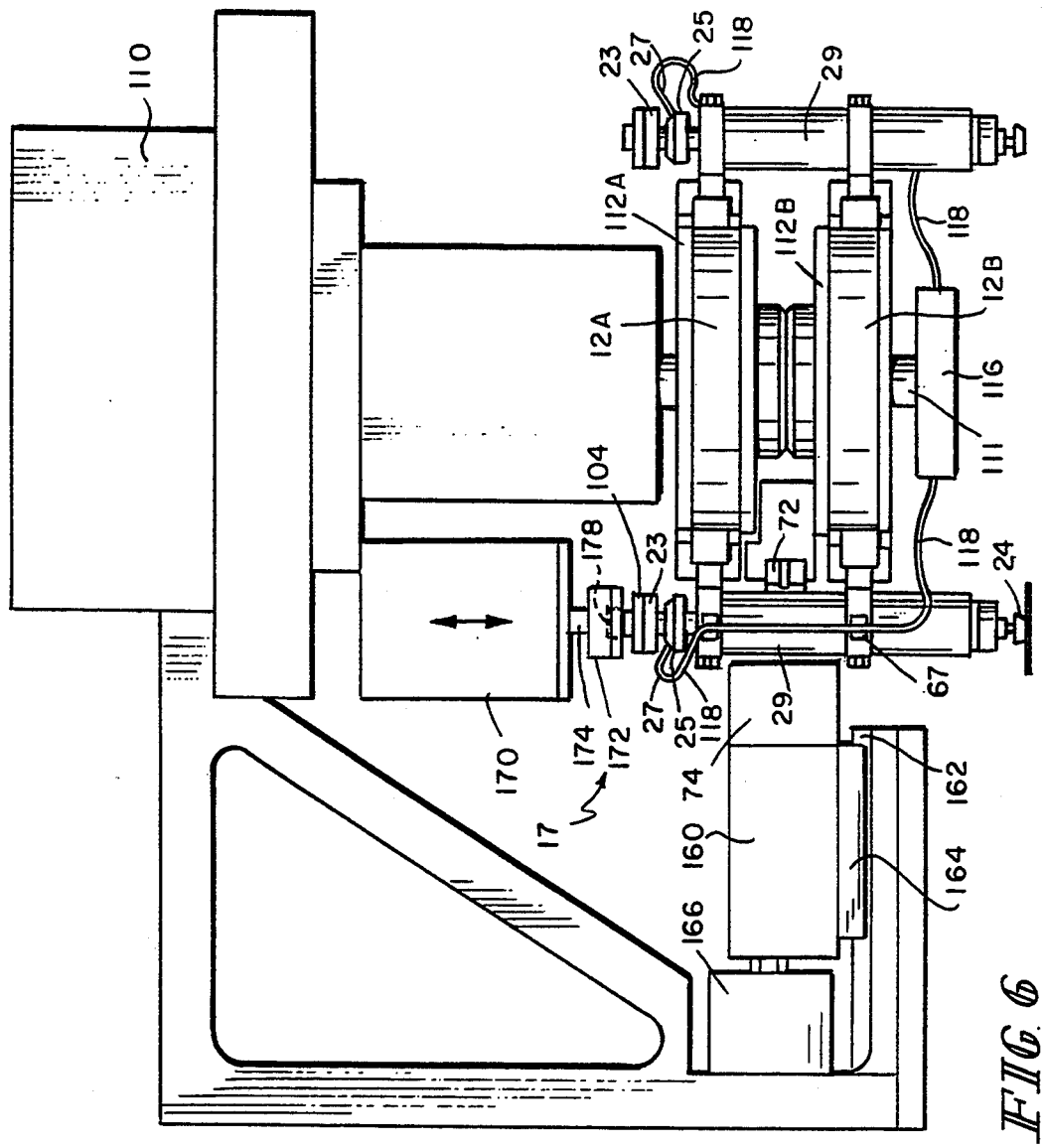
FIG. 6 is a side view of a station with a driver which adjust the θ or angular position of the head.

The die adjust station is illustrated in FIG. 6. Since the die camera 52 is below the belts 12A and 12B, there is no need to move the $\theta$ or angular position adjustment in and out of the path of the head 24 at station 17. The movable jaw 74 is mounted to a carriage 160 which slides along rail 162 of the frame on slide 164. An operator 166, illustrated as a cylinder, extends and retracts the movable jaw 74. The $\theta$ adjust motor 70 is positioned above and along the axis of the head 24 and station 17. A driving block 172 is connected to the motor 170 by shaft 174. A non-slip or high friction pad 176 is provided on the end of block 172 and mates with and drives the drive coupler 23 of the head 24 via its non-slip high friction pad 104. A recess 178 in the face of pad 176 and block 177 accommodates the head 102 of the drive coupler 23. The motor 170 has sufficient torque to overcome the friction of the pad 108 which maintains the shaft 80 rotational fixed with respect to the housing 29. An operator, not shown, raises and lowers the $\theta$ adjust motor 170.

The position of the drivers for the operation to be performed at the appropriate station and their operation is dependent upon the system to which the present transport system is provided. If there are cameras or monitors which require the drive to be out of the line of sight, the drivers are mounted to the carriage which carries and positions the movable jaw of the clamp. If they are not in the line of sight of a camera or monitoring system, they need not be mounted to the carriage of the clamp and may be independently mounted to the frame. As an alternative, the $\theta$ adjust motor 170 may also be mounted to the carriage of the movable jaw 74 using the same structure as that illustrated in FIG. 5 for the Z driver.

As can be seen from the drawings, the flexible belts 12 A/B, the clamp 70, and the modified die transport 10 can be readily mounted to existing bonder systems and generally within the envelope thereof. This does not require a specially designed machine to accommodate these specific elements. Thus the through-put can be substantially increased and the individual control of each of the tools may be achieved without a substantial increase of cost. Although the through-put has been limited in the example of FIG. 2 since only two of the three stationary processing stations may be performed simultaneously, it is still a substantial improvement over the system of FIG. 1. Preferably the stationary processing stations are equally spaced allowing simultaneous operation of all stationary stations.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An apparatus for bonding an electronic die to a substrate and including a die supply station, a bonding station, at least one processing station between said die supply station and said bonding station, and die transport means for transporting dies along a path between said stations, said die transport means comprising:
a plurality of head means each for holding a die;
conveyor means including two vertically spaced and coaxial endless belts for spacing and moving said plurality of head means along a closed loop including said path;
alignment means at each of said stations for aligning said head means at a fixed position along said path in two orthogonal directions at said stations independently of said conveyor means; and
control means for controlling said conveyor means to position said plurality of head means at said stations and controlling said head means at said stations.

2. An apparatus according to claim 1, wherein said endless belts are flexible and include flexible mounting means for flexibly mounting said head means to said endless flexible belts.

3. An apparatus according to claim 1, wherein said head means are spaced along said conveyor means such that more than one head means is in said path at a time.

4. An apparatus according to claim 1, wherein said head means are spaced along said conveyor means such that more than one station has a head means positioned thereat at a time.

5. An apparatus according to claim 1, including a fly processing station; and wherein said control means moves said conveyor means intermittently to position said heads at said die supply, bonding and processing stations and move said heads through said fly processing station.

6. An apparatus according to claim 1, wherein said alignment means includes a first jaw stationary at a fixed position and a second jaw movable towards said first jaw to align and clamp said head means to said stationary first jaw; said control means includes drive means for mating with said head means at a station to control the orientation of said head means at said station; and a common carriage means for positioning said second jaw and said drive means at said station.

7. An apparatus according to claim 6, wherein said drive means at one of said stations raises and lowers said head means.

8. An apparatus according to claim 1, wherein said control means includes drive means for rotating said head means about a vertical axis; said head means includes retainer means for holding a die using a vacuum; and connection means for connecting a source of a vacuum to said head means such that said head means rotates relative to said connection means.

9. An apparatus according to claim 1, wherein at least two of said head means are configured for different dies and said control means is programmable for each configuration.

10. An apparatus according to claim 1, wherein said control means is programmable to selectively operate or not operate each of head means at each station.

11. An apparatus according to claim 1, wherein said control means includes drive means for mating with said head means at a station to adjust the orientation of the head means at said station.

12. An apparatus according to claim 11, wherein said drive means at one of said stations raises and lowers said head means.

13. An apparatus according to claim 11, wherein said drive means at one of said stations rotates said head means about a vertical axis.

14. An apparatus for bonding an electronic die to a substrate and including a die supply station, a bonding station, at least one processing station between said die supply station and said bonding station, and die transport means for transporting dies along a path between said stations, said die transport means comprising:
a plurality of head means each including a head housing and a head for holding a die using a vacuum;
a conveyor means including at least one endless belt for spacing and moving said plurality of head means along said path;
mounting means for mounting said head means to said endless belt;
alignment means at each of said stations for engaging said head housing and aligning said head means at a fixed position along said path in two orthogonal directions at said stations;
first drive means for mating with said head at a station and rotating said head relative to said mounting means about a vertical axis;
second drive means for mating with said head at a station and raising and lowering said head to said mounting means;
connection means for connecting a source of a vacuum to each of said heads such that said head rotates relative to said connection means and is fixed vertically relative to said connection means; and
control means for controlling said conveyor means to position said plurality of head means at said stations, controlling said first and second drive means and controlling said vacuum to hold and release a die.

15. An apparatus according to claim 14, wherein said second drive means lowers said head and a spring raises said head when said second drive means is raised.

16. An apparatus according to claim 14, whereto said connection means includes a connection housing rotatably mounted and vertically fixably mounted to said head and tubing connecting said connection housing to said source of a vacuum.

17. An apparatus according to claim 16, wherein said tubing is mounted to said mounting means to rotatably fix said connection housing relative to said mounting means.

18. An apparatus for bonding an electronic die to a substrate and including a die supply station, a bonding station, at least one processing station between said die supply station and said bonding station, and die transport means for transporting dies along a path between said stations, said die transport means comprising:
a plurality of head means each for holding a die;
conveyor means for spacing and moving said plurality of head means along said path;
clamping means at each of said stations and having at least a first and a second jaws movable relative to each other transverse to said path for clamping said head means at a fixed position along said path at said stations; and
control means for controlling said conveyor means to position said plurality of head means at said stations and controlling said head means at said stations.

19. An apparatus according to claim 18, wherein said first jaw is stationary at a fixed position and said second jaw moves towards said first jaw to align and clamp said head means to said stationary first jaw.

20. An apparatus according to claim 19, wherein said second jaw includes an indenture to center said head means in said clamping means.

* * * * *